(12) United States Patent
Smith

(10) Patent No.: US 6,965,271 B2
(45) Date of Patent: Nov. 15, 2005

(54) PHASE-LOCKED LOOP

(75) Inventor: Alan Andrew Smith, Farnborough (GB)

(73) Assignee: Qualcomm Incorporated, San Diego, CA (US)

(*) Notice: Subject to any disclaimer, the term of this patent is extended or adjusted under 35 U.S.C. 154(b) by 57 days.

(21) Appl. No.: 10/466,788

(22) PCT Filed: Dec. 18, 2001

(86) PCT No.: PCT/GB01/05610

§ 371 (c)(1),
(2), (4) Date: Jan. 20, 2004

(87) PCT Pub. No.: WO02/060064

PCT Pub. Date: Aug. 1, 2002

(65) Prior Publication Data

US 2004/0113703 A1 Jun. 17, 2004

(30) Foreign Application Priority Data

Jan. 25, 2001 (GB) .............................. 0101954

(51) Int. Cl.⁷ ................................................ H03L 7/00
(52) U.S. Cl. ........................................ 331/1 A; 327/25
(58) Field of Search ........................... 331/1 A, 17, 25, 331/34; 327/141, 156; 375/375, 376

(56) References Cited

U.S. PATENT DOCUMENTS

| 6,111,807 A | * | 8/2000 | Ooishi ................... 365/230.01 |
| 6,150,891 A | | 11/2000 | Welland et al. ............... 331/25 |
| 6,718,473 B1 | * | 4/2004 | Mirov et al. ................ 713/320 |

FOREIGN PATENT DOCUMENTS

| EP | 0 755 120 A1 | 1/1997 |
| EP | 1 067 693 A1 | 1/2001 |
| JP | 9-18337 | 1/1997 |

* cited by examiner

*Primary Examiner*—Linh My Nguyen
(74) *Attorney, Agent, or Firm*—Russell Ben Miller

(57) ABSTRACT

A phase-locked loop has associated with it a first register set (21) for holding data defining a mode of operation of the phase-locked loop; and a second register set (22) for holding data defining a mode of operation of the phase-locked loop. Switches (27 to 30) for coupling one of the first and second register sets to receive data defining a new mode of operation while the other of the first and second register sets is connected to the phase-locked loop to cause the same to operate in the mode defined by the data in the other register set. The switches are reconfigurable to change the coupling so that the other register set is coupled to receive data defining a further new mode of operation while the one register set is connected to the phase-locked loop to operate in the new mode of operation.

15 Claims, 9 Drawing Sheets

PHASE-LOCKED LOOP

The invention relates to a phase-locked loop. More specifically, the invention relates to a phase-locked loop in which plural registers allow the phase-locked loop to switch quickly between different operating frequencies.

Mobile communications transceivers (for example a mobile telephone), generally comprise a single frequency synthesizer which serves as a local oscillator for both the transmit and receive sides of the transceiver. Such frequency synthesizers typically comprise one or more phase-locked loops (PLLs) that can be programmed to lock onto a specified frequency. In a mobile telephone for a cellular network, the PLL will be reprogrammed to oscillate at different frequencies for transmit and receive operations and when the telephone moves from one cell in the communications system to another (an operation known as handoff).

Thus, for example, in a so-called GSM system, the mobile telephone routinely switches between transmit (Tx) and receive (Rx) frequencies during the exchange of speech signals and also switches to other Rx frequencies in order to measure power in the signals received at the other frequencies, to determine whether the telephone is moving from one cell to another. Thus, the telephone performs a received signal strength indicator (RSSI) measurement between transmit and receive time slots in order to determine whether a handoff should be performed.

When a PLL is programmed to a new frequency it takes time for the loop to lock onto, i.e. settle at, the new frequency. FIG. 1 of the accompanying drawings illustrates in schematic form, typical timing of control signals of a conventional PLL. The signals are illustrated over three periods 1, 2 and 3. During period 1, the PLL is programmed to a new frequency and during period 2 the PLL goes through the process of locking onto the new frequency. In both period 1 and period 2, the PLL is unstable and thus cannot be used as a frequency reference. In period 3, the PLL has locked to the new frequency and is, therefore, stable and available for use as a frequency reference. The PLL is thus only active during period 3.

Programming of PLLs is normally done under the control of software. Typically, PLLs require 20 to 24 bits of data to specify a desired frequency and currently this takes about 60 $\mu S$ to load into the PLL. In a GSM mobile telephone, the time taken to tune to a frequency is required to be less than 250 $\mu S$. The 60 $\mu S$ delay of the PLL is, therefore, a significant overhead. PLLs capable of faster programming are available but these devices require a dedicated serial peripheral interface bus on the host chipset in order to achieve data rates of up to 20 Mbits/sec.

One way of overcoming these problems would be to use two PLLs. At any given time only one of the PLLs would need be active allowing the other PLL to be reprogrammed to the desired frequency in readiness for when it is required. The use of two PLLs is, however, expensive because, in addition to the cost of two PLLs, greater printed circuit board (PCB) must necessarily be made available. Furthermore, each PLL would require its own programming interface, and further control would also be necessary to switch between the two PLLs, thus increasing the amount of track area on the PCB and processing overheads.

The invention aims to address the above-discussed and related problems.

According to one aspect of the invention, there is provided an apparatus comprising: a phase-locked loop; first register set for holding data defining a mode of operation of the phase-locked loop; and coupling means for coupling the first register set of the phase-locked loop to cause the same to operate in a mode defined by the data held therein or to receive data defining a new mode of operation, characterized by: a second register set for holding data defining a mode of operation of the phase-locked loop; and the coupling means being arranged to couple one of the first and second register sets to receive data defining a new mode of operation while the other of the first and second register sets is connected to the phase-locked loop to cause the same to operate in the mode defined by the data in the other register set, and being reconfigurable to change the coupling so that the other register set is coupled to receive data defining a further new mode of operation while the one register set is connected to the phase-locked loop to cause the same operate in the new mode of operation.

According to another aspect of the invention, there is provided a method of operating a phase-locked loop, the method comprising: holding data defining a mode of operation of the phase-locked in a first register set; and coupling the first register set to the phase-locked loop to cause the same to operate in a mode defined by the data held therein or to receive data defining a new mode of operation, characterized by: holding data defining a mode of operation of the phase-locked loop in a second register set; and coupling one of the first and second register sets to receive data defining a new mode of operation while the other of the first and second register sets is connected to the phase-locked loop to cause the same to operate in the mode defined by the data in the other register set, and reconfiguring the coupling so that the other register set is coupled to receive data defining a further new mode of operation while the one register set is connected to the phase-locked loop to cause the same to operate in the new mode of operation.

According to a further aspect of the invention, there is provided a mobile telephone comprising the aforementioned appartus.

The above and further features of the invention are set forth with particularity in the appended claims and together with advantages thereof will become clearer from consideration of the following detailed description of an exemplary embodiment of the invention given with reference to the accompanying drawings.

Figure 2:
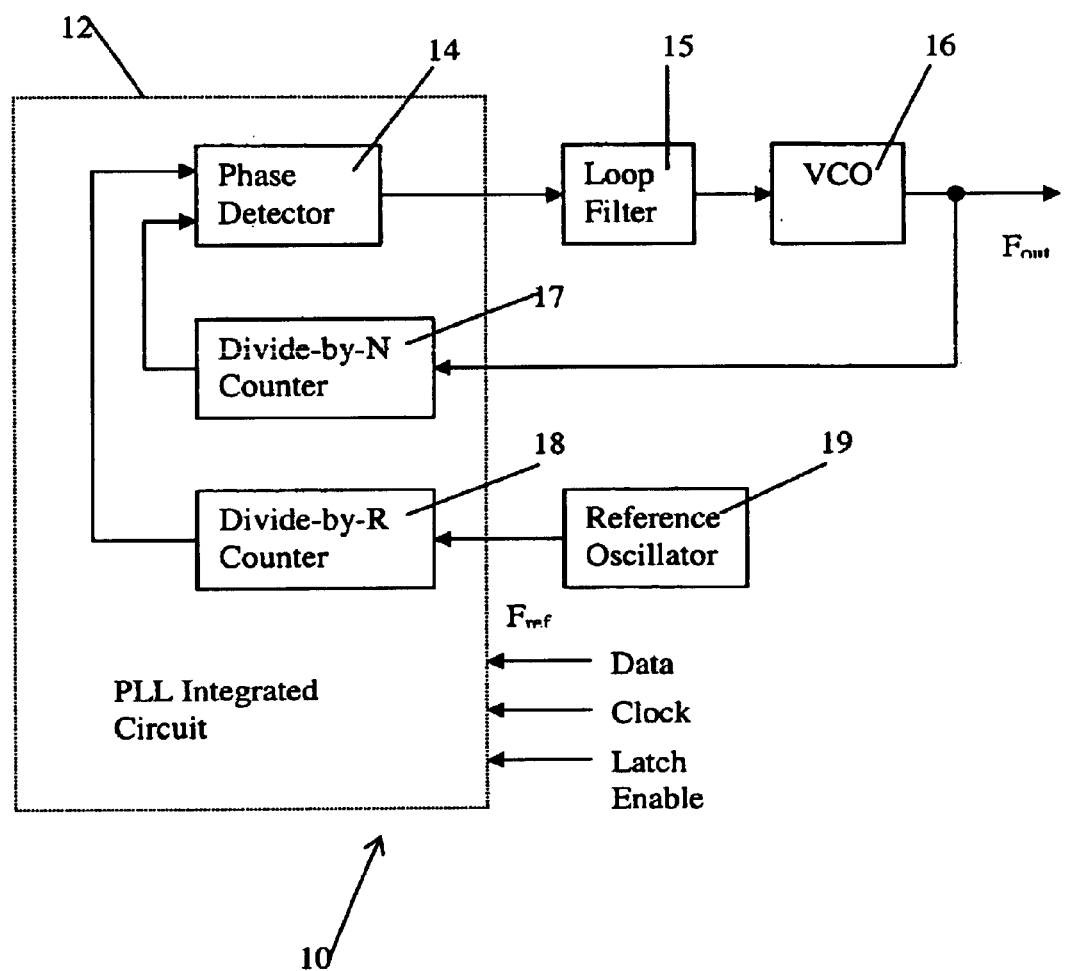
FIG. 2 is a schematic diagram of PLL embodying the invention.

Turning now to FIG. 2 of the accompanying drawings, there is shown a phase-locked loop (PLL) 10, which is typically supplied in part in integrated circuit 12 form and comprises a phase detector 14, a loop filter 15, a voltage-controlled oscillator (VCO) 16, a programmable divide-by-N counter 17, and a programmable divide-by-R counter 18. A reference oscillator 19 drives the divide-by-R counter 18. The integrated circuit 12 also comprises an input for a data signal, an input for a clock signal and an input for a latch enable signal.

The data is input serially and synchronously to the integrated circuit 12 using the clock signal and is stored in registers (not shown in FIG. 2). When the latch enable signal active, the data is transferred from the registers into the counters 17 and 18. The divide-by-N counter 17 counts N pulses before producing a pulse and then repeats the process. The output frequency of the divide-by-N counter 17 is therefore N times less than that of its output. Likewise, the frequency of the signal output from the divide-by-R input is R times less than that of the signal input thereto by the reference oscillator 19.

As will be appreciated by those possessed of the appropriate skills, the PLL 10 outputs a signal from the VCO 16 at a frequency ($f_{out}$) equal to the frequency ($f_{ref}$) of the reference oscillator 16 multiplied by the ratio of N and $R_1$ i.e. $f_{out=(N/R)fref}$.

Figure 3:
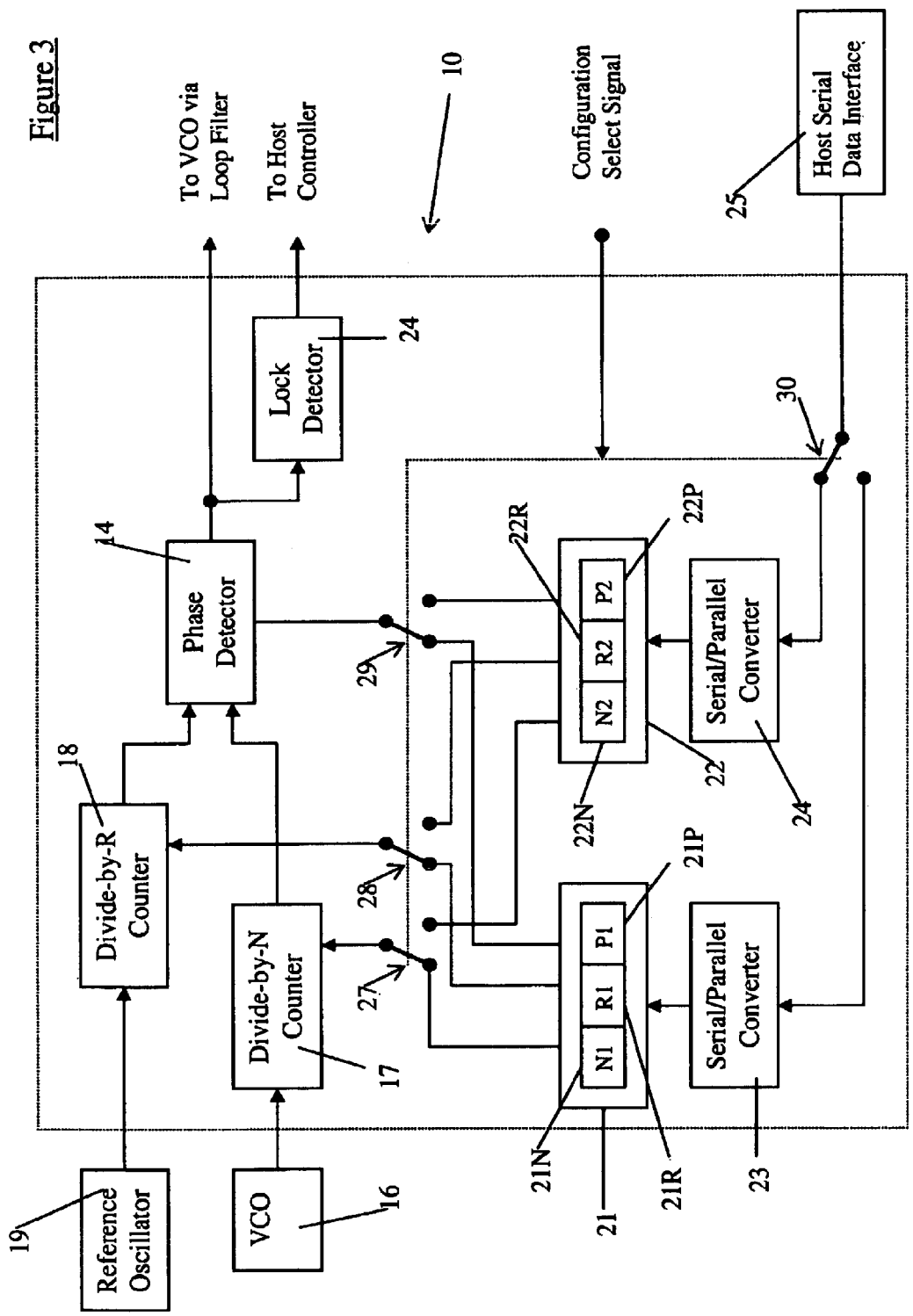
FIG. 3 is a schematic diagram showing part of the PLL in greater detail.

FIG. 3 of the accompanying drawings shows part of the PLL 10 in greater detail. The PLL 10 comprises two register sets 21, 22, each of which stores data defining a respective configuration for the PLL 12. Each register set 21, 22 has an associated serial/parallel converter 23, 24 connected to receive data in serial form from the host serial data interface 25 of a host microcontroller (not shown). Each register set 21, 22 comprises a register 21N, 22N for holding data for the divide-by-N counter 17, a register 21R, 22R for holding data for the divide-by-R counter 18 and a register 21P, 22P for holding data for the phase detector 14. The phase detector data in the registers 21P, 22P defines the gain applied by the phase detector 14.

Also shown in FIG. 3 is a lock detector 24 coupled to the phase detector 14 for providing an indication to the host microcontroller (not shown) when the PLL 10 has locked onto the desired frequency, i.e. when it has become stable. Switches 27, 28 and 29 are provided to switch the divide-by-N counter 17, the divide-by-R counter 18 and the phase detector 14 between the two register sets 21, 22. A further switch 30 is provided to switch the host serial data interface 25 from the host microcontroller (not shown) between the two serial to parallel converters 23, 24. All of the switches 27 to 30 are controlled by a configuration select control signal 32 generated by the host microcontroller (not shown).

Figure 1:
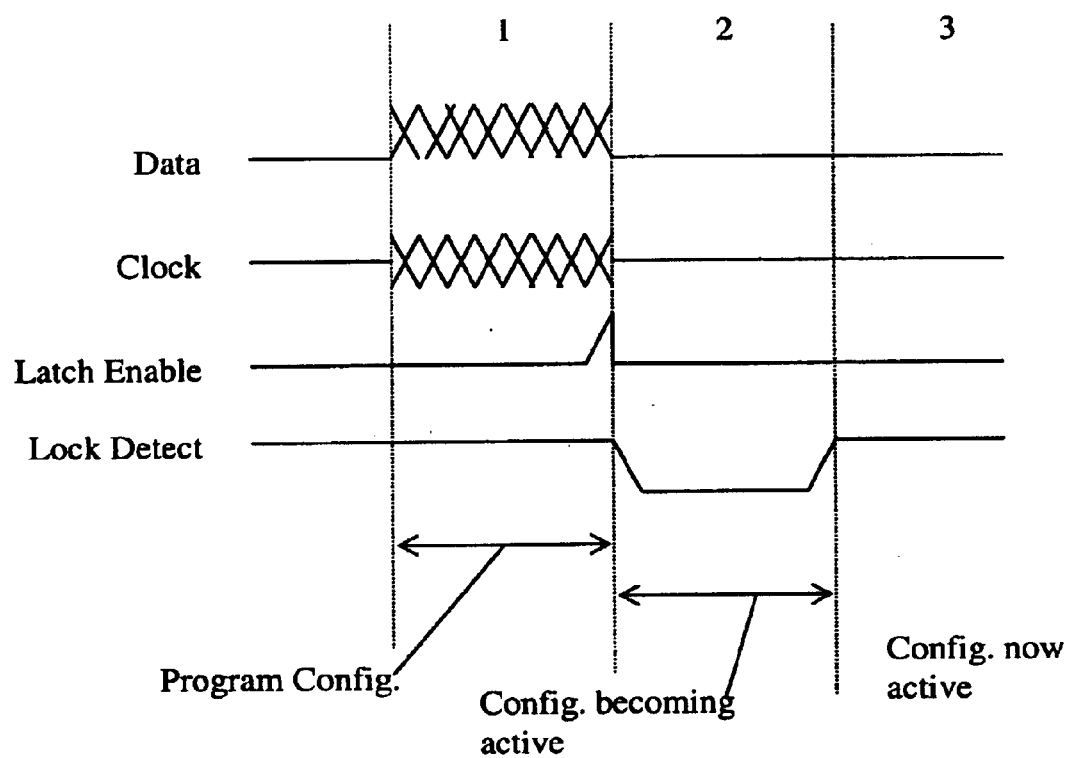
FIG. 1 is a schematic diagram representing timing in a conventional phase-locked loop (PLL) as already discussed hereinabove.

The switches are arranged so that when the first register set 21 is coupled to the divide-by-N counter 17, the divide-by-R counter 18 and the phase detector 14, the second register set 22 is coupled via the switch 30 to the host serial data interface 25 from the host microcontroller, and when the second register set 22 is connected to the divide-by-N counter 17, etc, the first register set 21 is connected to the serial data interface 25. In this way, one set of registers 21, 22 can be loaded with new data while the other set of registers 21, 22 is controlling operation of the divide-by-N counter 17, etc. This provides a much more efficient way of switching between different frequencies by reducing the amount of time that the PLL is inactive. The period 1 in FIG. 1 is eliminated.

Furthermore, the gain control, provided by the register 21P, 22P over the phase detector 14, enables the PLL to be controlled so that it settles sooner to the new frequency. When the frequency of the PLL is changed, the PLL will lose lock on the signal. It takes time for the PLL to lock onto the new frequency, which time depends on the gain of the loop. A higher loop gain reduces the time taken for the PLL to lock but provides less stability once locked. A lower loop gain increases the time taken but provides greater stability once locked.

A suitable value of P is, therefore, chosen that balances the time taken with the degree of stability. Alternatively, the registers 21P and 22P may be provided with two values of P. One value is high and is selected when the PLL is attempting to lock onto the frequency the other value is low and is selected once lock has been achieved. The modification to do this would be the addition of another control line from the lock detector 24 back to the registers 21P and 22P to switch between the two values of P.

One advantage of eliminating the delay hitherto associated with programming the PLL is that it is possible to switch off, or at least power down into a stand-by mode, the PLL during periods of inactivity. In applications such as a mobile telephone for a GSM system, there are several periods between transmission and reception where the PLL is not required. During these periods, the PLL may be powered down to conserve battery life. The control of the gain of the phase detector 14 may reduce further the period of time during which the PLL needs to be fully powered.

Figure 4:
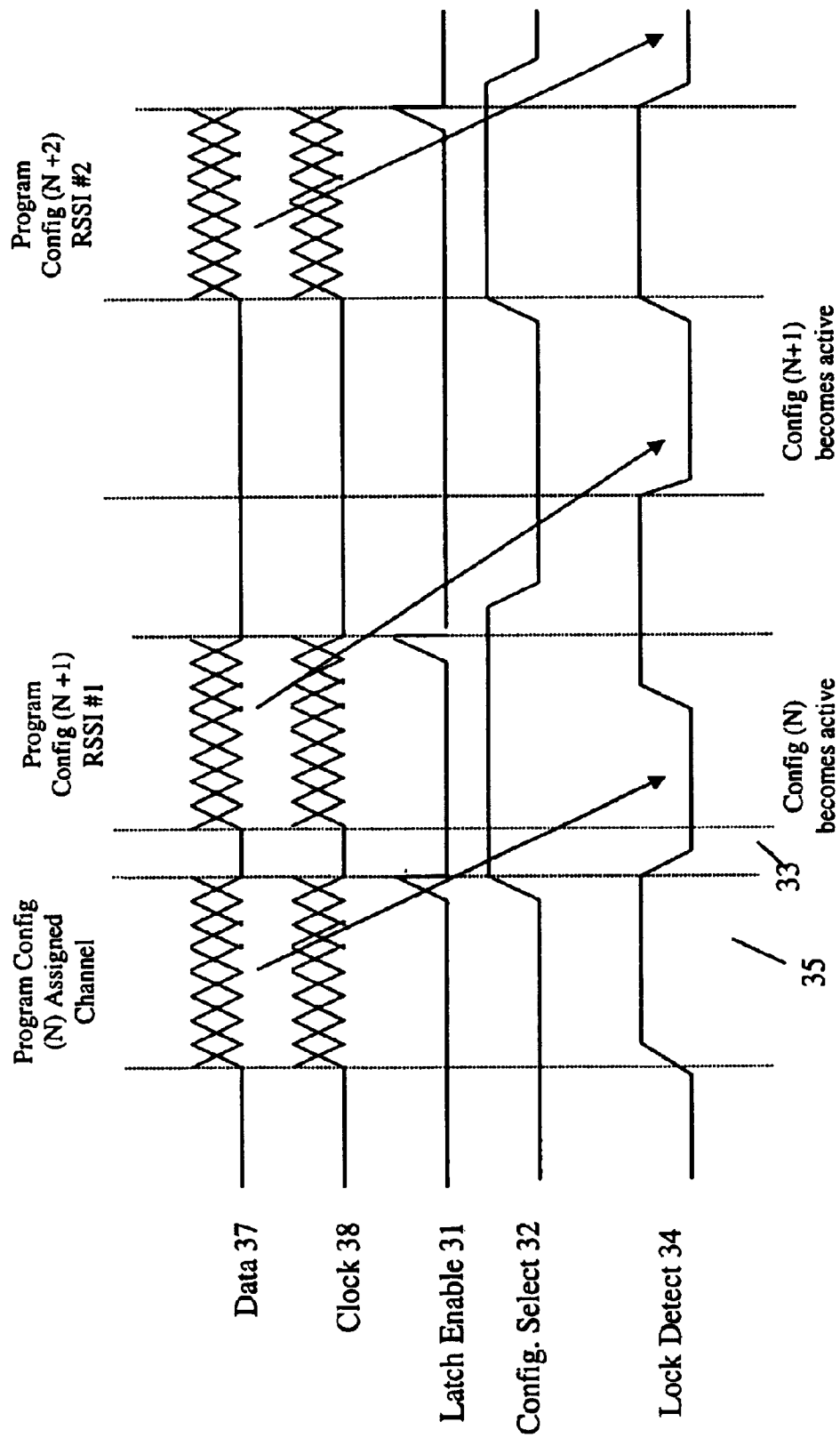
FIG. 4 is a timing diagram of the operation of the PLL.

FIG. 4 is a timing diagram of signals in the PLL 10. A latch enable signal 31 causes data to be latched in the register sets 21, 22. The configuration select signal 32 selects between the two registers 21, 22. After the configuration select signal 32 changes state, there follows a period 33 during which the PLL first loses lock and during the period the lock detect signal 34 is low. Once lock is recovered, the lock detect signal 34 goes high and remains high during a period 35 until the configuration select signal again changes state.

During the period 35, the PLL is active in that it can be used as a reference for the desired frequency. During this period, the PLL operates in accordance with the data in one of the register sets, say register set 21. Also during this period, the other register set, say set 22, is loaded with new configuration data 37, clocked in at a rate determined by a system clock 38.

It will be appreciated from the foregoing that the PLL 10 is well suited for use in applications where switching between plural different frequencies is required. One such application is a mobile telephone for a GSM system.

Figure 5:
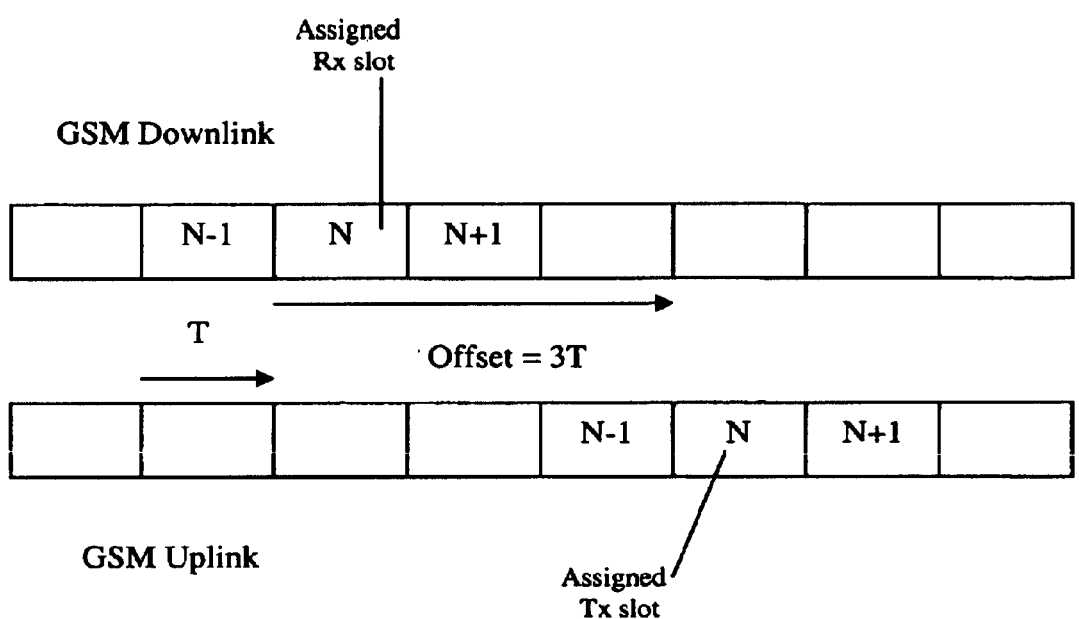
FIG. 5 is a timing diagram of GSM system downlink (mobile unit receives) and uplink (mobile unit transmits) timeslots.

FIG. 5 of the accompanying drawings shows various time slots in a GSM system. Typically, the mobile telephone is assigned a transmit time slot that is three slots away from the assigned received time slot. This means that there are two available slots between receive and transmit and four available slots between transmit and receive. These slots may be utilised to power down the PLL and/or to perform other operations necessary to the GSM standard.

Figure 6:
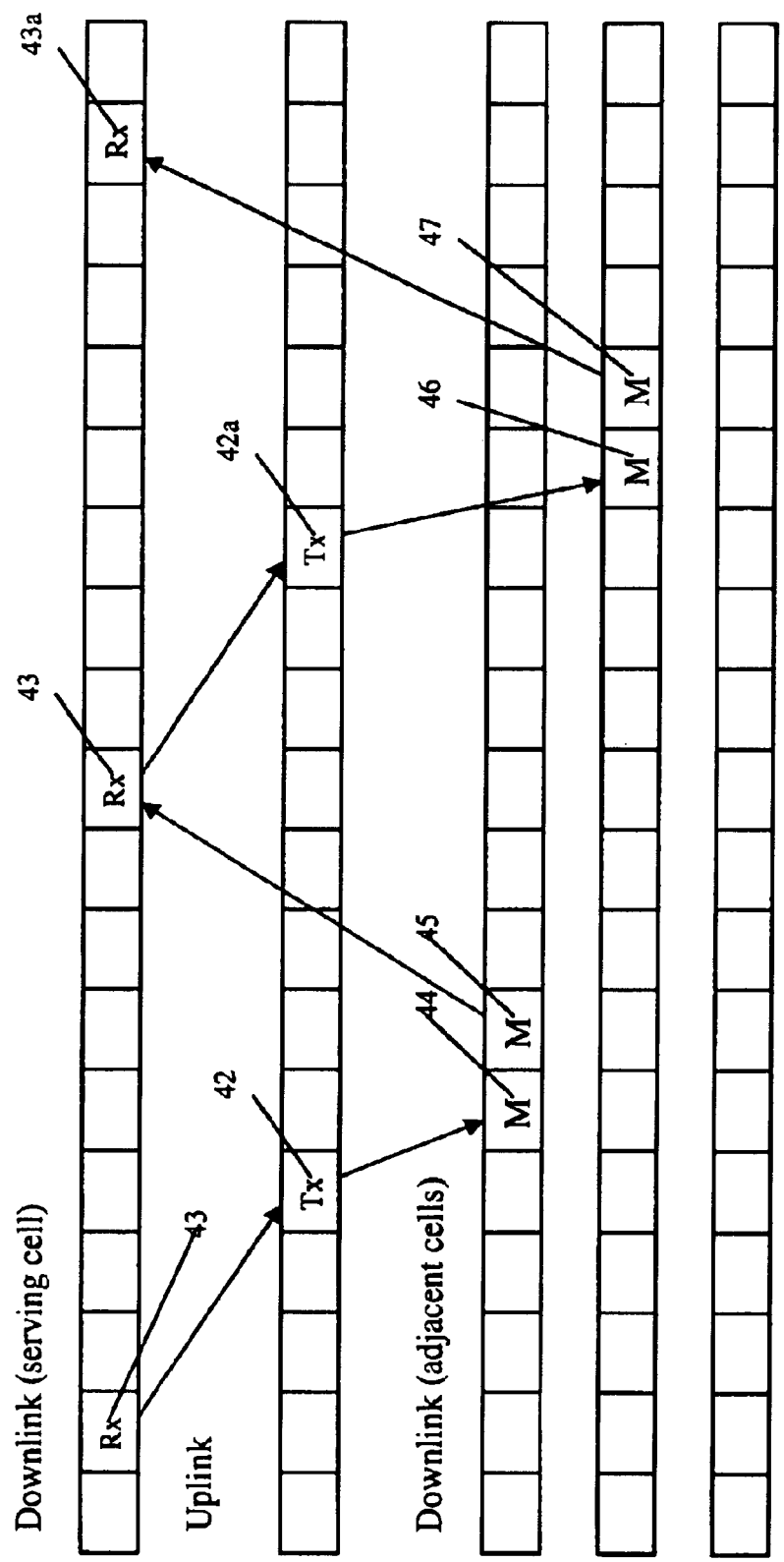
FIG. 6 is a timing diagram of a GSM system showing receive, transmit and monitor functions.

FIG. 6 of the accompanying drawings shows how two of the slots between transmit 42 and receive 43 are used to monitor transmissions from adjacent cells in the GSM system. In Monitor (M) time slots 44 and 45, the transmissions from a first adjacent cell are monitored. Similarly, in timeslots 46 and 47 transmissions 42a and 43a from a second adjacent cell are monitored.

As soon as the Tx timeslot has ended, the PLL must be reprogrammed for the Monitor timeslots. As soon as the Monitor timeslots have ended, the PLL must be reprogrammed for the Rx timeslot.

The adjacent cells may not be synchronised with the current or serving cell and, therefore, it may take additional time during the monitor time slots (44 to 49) to achieve frame synchronisation (in the first timeslot) before adjacent cell data can be decoded (in the second timeslot). Once camped onto a cell, the mobile telephone is required under GSM to read the broadcast control channel (BCCH) data on the best 6 non-serving cells. This must be done within 30 seconds. The mobile telephone will try to read the BCCH data for the best 6 non-serving cells at least every 5 minutes. In addition, it will try to read the synchronisation channel (SCH) data for the best 6 non-serving cells every 30 seconds.

Figure 7:
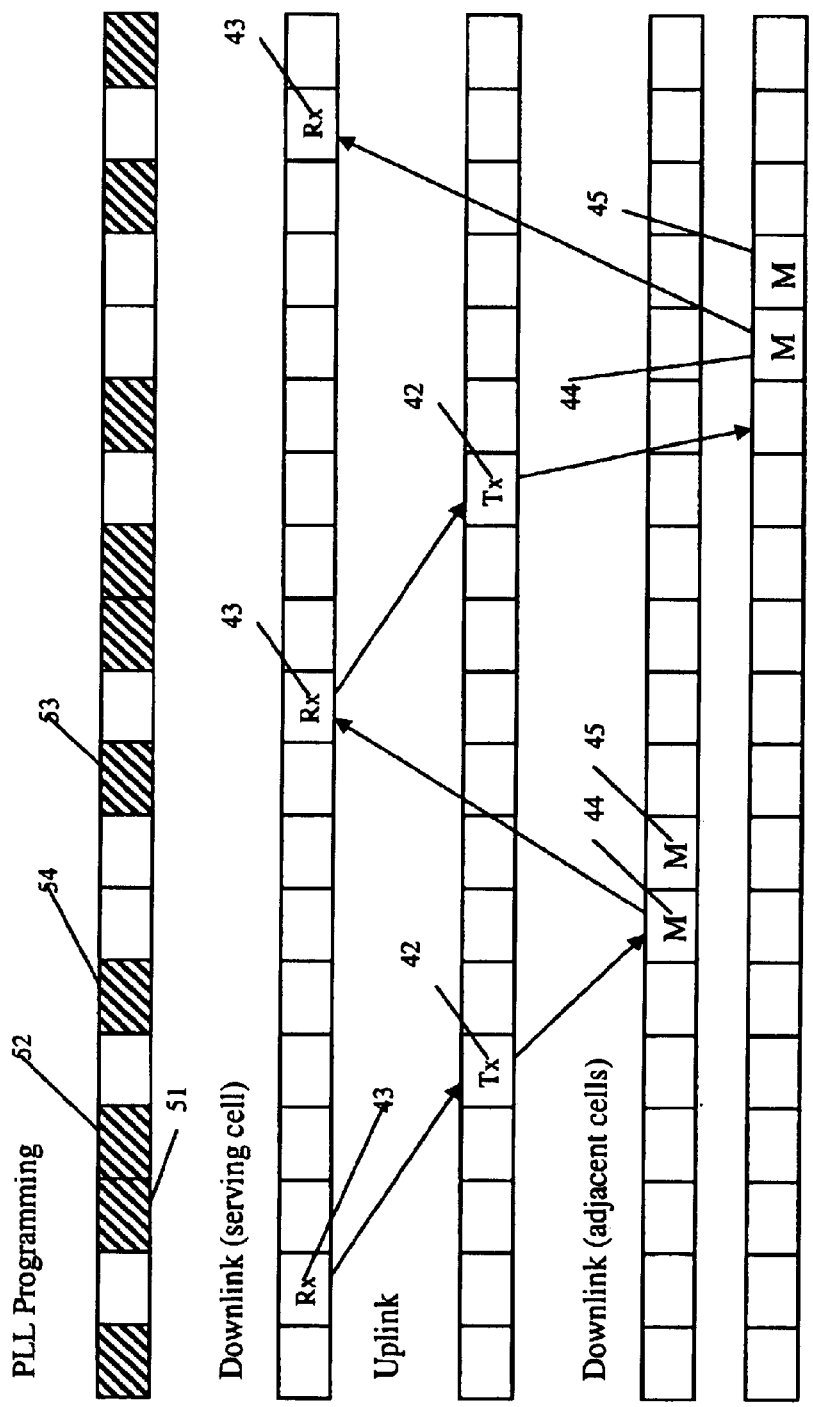
FIG. 7 is a timing diagram showing how a conventional PLL would be programmed for a GSM environment.

FIG. 7 of the accompanying drawings shows the GSM timeslots that would be taken up with configuration and programming of a conventional PLL. The timeslots are shown with reference to the PLL status in the top line of slots shown in FIG. 7. Starting at the receive timeslot 43, during the receive slot 43, the PLL is in an active configuration (at the receive frequency). In the next two slots 51,52, the PLL is reconfigured to the transmit frequency. In the transmit slot 42, the PLL is in an active configuration (at the transmit frequency). There is only one timeslot between end of monitoring and start of reception, namely slot 53, and between end of transmission and start of monitoring, namely slot 54, in which to get the PLL both programmed and locked onto the required frequency. Therefore, as soon as the transmit 42 timeslot has ended, the PLL must be reprogrammed for the approaching monitor timeslots 44,45 and as soon as timeslot 45 has ended, the PLL must be reprogrammed for the approaching receive timeslot 43. Plainly, this is undesirable because it gives no free time to do anything else.

Figure 8:
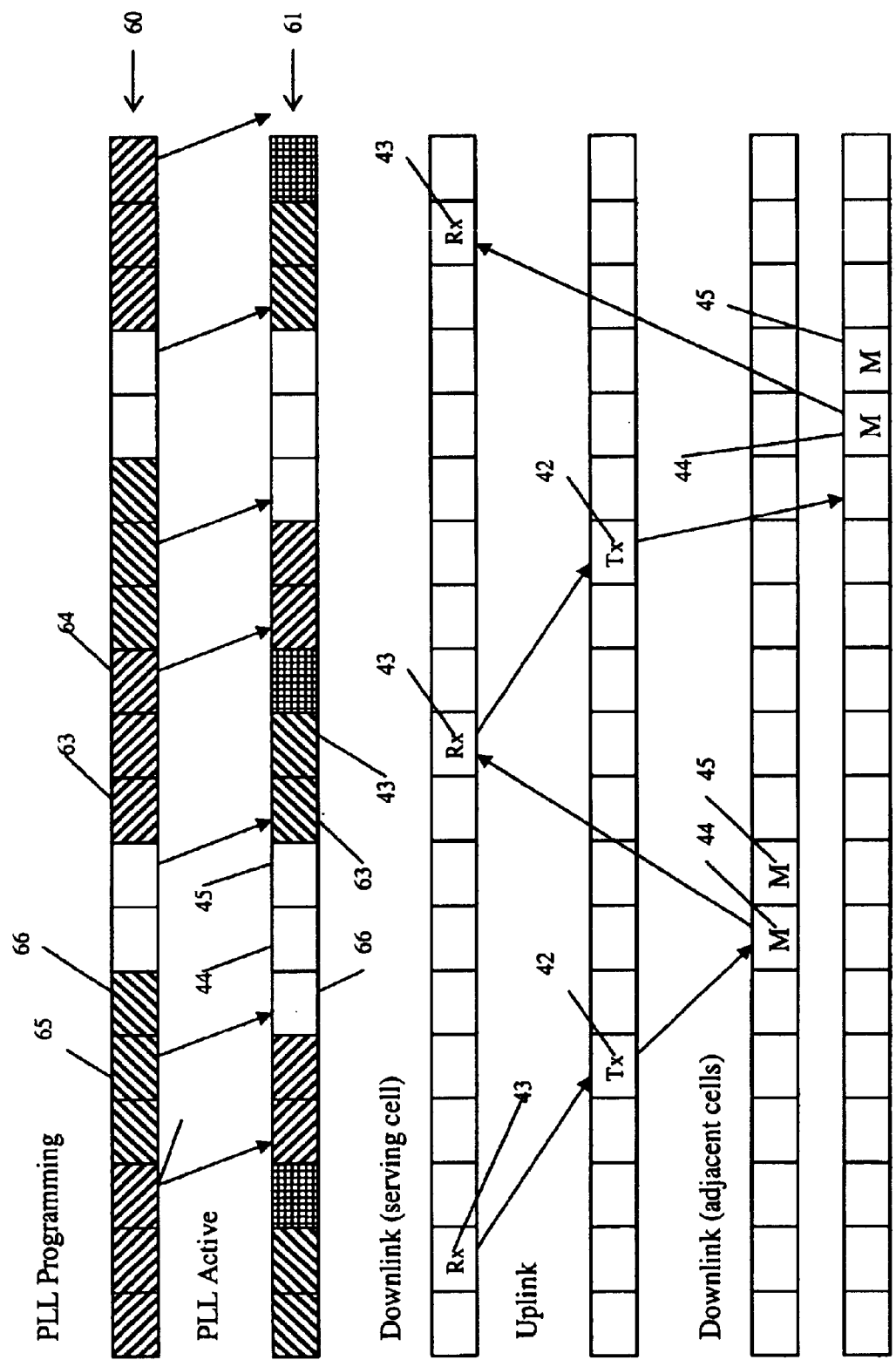
FIG. 8 shows one way in which the FIG. 3 PLL can be programmed in a GSM environment.

FIG. 8 of the accompanying drawings shows how one of the above-described PLL 10 releases timeslots for other uses (including powering down the PLL if desired). The timeslots are shown with reference to the PLL programming windows in the top line 60 of slots shown in FIG. 8 and active configuration windows in the line 61 below that. Starting with reference to the receive timeslot 43, during the receive timeslot 43, and the slots 63 and 64, preceding and succeeding the receive timeslot, the PLL 10 may be programmed in the Tx configuration. The PLL is also active in the Rx configuration during timeslots 63 and 43. During the transmit timeslot 42 and the slot 65 preceding it, the PLL 10 may be programmed in the monitor configuration and is also active in the Tx configuration. During the monitor timeslots 44 and 45 and the timeslot 66 preceding them, the PLL may be programmed in the Rx configuration and for all three timeslots 44,45,66 is active in the monitor configuration.

As the active configuration and the programming have been uncoupled, i.e. separated from each other, there is more flexibility in time during which configurations can be programmed. All configurations have a programming window of at least two timeslots prior to when they are required to be active.

The time taken for the PLL and VCO to lock to the desired frequency is thus only dependent on the settling time of the VCO loop, because the time taken to reprogram the PLL no longer reduces the total time available as the reprogramming is done while a different configuration is active. This allows the PLL to be put into power-save modes with the next configuration already programmed so that when it is taken out of power-save mode, it will go straight into locking the VCO.

For example, to be configured for the Rx timeslot, the configuration for the Rx frequency must become active in the prior timeslot which, in turn, requires the configuration to be programmed in any of the three timeslots prior to that. Hence, while the PLL is using the configuration for the monitor adjacent cells function, the idle configuration in the PLL can be programmed for the upcoming Rx timeslot. Similarly, while the Rx configuration is active, the idle configuration in the PLL can be programmed for the upcoming Tx timeslot and, while the Tx configuration is active, the idle configuration in the PLL can be configured for the upcoming monitor timeslots.

Figure 9:
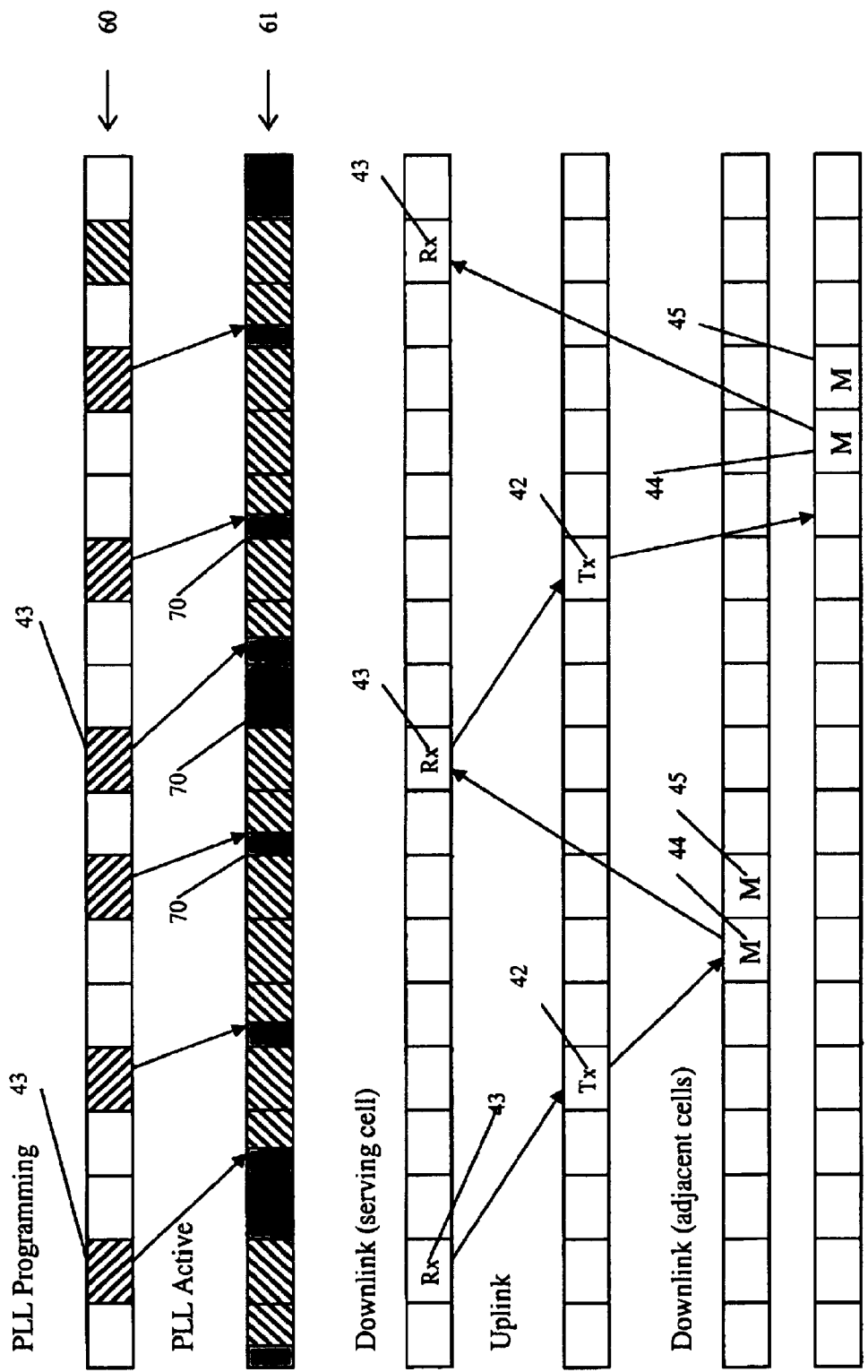
FIG. 9 shows a timing diagram for power saving.

FIG. 9 shows one example of how to implement a possible power saving scenario using the new PLL design. By pre-programming the next Tx configuration for the Tx timeslot 42 during the Rx timeslot 43 and then, at the end of the Rx timeslot performing the changeover to the Tx configuration and putting the PLL immediately into power-save mode 70, the PLL will immediately start using the Tx configuration when it is taken out of power-save save mode. This gives the fastest possible VCO lock-up time possible when exiting from power-save mode.

It will be appreciated from the foregoing that the PLL has advantages in particular for communications systems such as GSM where the frequency needs to be changed regularly. One advantage is that the variable time required to program the PLL is substantially or entirely eliminated, as the programming for one configuration or mode can be done while the other configuration is active. As a consequence, the performance of the PLL synthesizer subsystem becomes dependent only on the acquisition and lock-in times of the PLL itself.

Another advantage lies in handover situations. GSM handsets regularly have to provide measurements of surrounding cell-site signal strengths in order to assess the need for a hand-over. Conventionally, this is performed by tuning to alternative RF channels between the Tx and Rx timeslots, measuring the RSSI and subsequently tuning back to the assigned channel. Using the above-described method, the requirement to keep re-programming the PLL with the assigned channel can be removed. One configuration can be maintained once programmed (the assigned channel), while the other configuration can be used to control the tuning for RSSI measurements.

A further advantage is that timeslots are freed that allow the PLL to be powered-down, thereby reducing power consumption and, in mobile applications for example, extending battery life.

Having thus described the invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof.

What is claimed is:

1. An apparatus comprising:
   a phase-locked loop;
   a first register set for holding data defining a mode of operation of the phase-locked loop;
   coupling means for coupling the first register set to phase-locked loop to cause the same to operate in a mode defined by the data held therein or to receive data defining a new mode of operation; and
   a second register set for holding data defining a mode of operation of the phase-locked loop,
   the coupling means being arranged to couple one of the first and second register sets to receive data defining the new mode of operation while the other of the first and second register sets is connected to the phase-locked loop to cause the same to operate in the mode defined by the data in the other register set, and being reconfigurable to change the coupling so that the other register set is coupled to receive data defining a further new mode of operation while the one register set is connected to the phase-locked loop to cause the same to operate in the new mode of operation.

2. An apparatus as claimed in claim 1, wherein the phase-locked loop comprises a divide-by-N counter and each of the first and second register sets comprises a register for storing a value of N for the divide-by-N counter.

3. An apparatus as claimed in claim 1, wherein the phase-locked loop comprises a divide-by-R counter and each of the first and second a register sets comprises a register for storing a value of R for the divide-by-R counter.

4. An apparatus as claimed in claim 1, wherein the phase-locked loop comprises a phase detector and each of the first and second register sets comprises a register for storing a value defining gain in the phase detector.

5. An apparatus as claimed in claim 1, wherein the coupling means is arranged to couple each of the first and second register sets to an external controller to receive said data therefrom.

6. An apparatus as claimed in claim 4, wherein the phase-locked loop comprises a lock detector for detecting locking of the phase-locked loop and outputting a signal indicative of said locking.

7. An apparatus as claimed in claim 6, further comprising a controller for controlling the coupling means.

8. An apparatus as claimed in claim 7, wherein the controller is arranged to generate said data defining a mode of operation and to output the data for the first and second register sets.

9. An apparatus as claimed in claim 7, wherein the controller is responsive to the signal from the lock detector.

10. An apparatus as claimed in claim 8, wherein the controller is arranged to output said data in serial form, the apparatus further comprising a serial/parallel converter for converting the serial data from the controller into parallel form for the first and second register sets.

11. A method of operating a phase-locked loop, the method comprising:

holding data defining a mode of operation of the phase-locked loop in a first register set;

coupling the first register set to the phase-locked loop to cause the same to operate in a mode defined by the data held therein or to received data defining a new mode of operation;

holding data defining a mode of operation of the phase-locked loop in a second register set;

coupling one of the first and second register sets to receive data defining the new mode of operation while the other of the first and second register sets is connected to the phase-locked loop to cause the same to operate in the mode defined by the data in the other register set; and reconfiguring the coupling so that the other register set is coupled to receive data defining a further new mode of operation while the one register set is connected to the phase-locked loop to cause the same to operate in the new mode of operation.

12. A method as claimed in claim 11, wherein the phase-locked loop comprises a divide-by-N counter, the method further comprising storing a value of N therefor in the register sets.

13. A method as claim in claim 11, wherein the phase-locked loop comprises a divide-by-R counter, the method further comprising storing a value of R therefor in each of register sets.

14. A method as claimed in claim 11, wherein the phase-locked loop comprises a phase detector, the method further comprising storing a value defining gain thereof in each of the register sets.

15. A mobile telephone comprising the apparatus of claim 1.

* * * * *